United States Patent
Schier

(10) Patent No.: US 8,491,996 B2
(45) Date of Patent: Jul. 23, 2013

(54) COATED TOOL

(75) Inventor: Veit Schier, Leinfelden-Echterdingen (DE)

(73) Assignee: Walter AG, Tubingen (DE)

( * ) Notice: Subject to any disclaimer, the term of this patent is extended or adjusted under 35 U.S.C. 154(b) by 433 days.

(21) Appl. No.: 12/666,241

(22) PCT Filed: May 16, 2008

(86) PCT No.: PCT/EP2008/056038
§ 371 (c)(1), (2), (4) Date: Apr. 8, 2010

(87) PCT Pub. No.: WO2009/003756
PCT Pub. Date: Jan. 8, 2009

(65) Prior Publication Data
US 2010/0260560 A1 Oct. 14, 2010

(30) Foreign Application Priority Data
Jul. 2, 2007 (DE) .................. 10 2007 030 734

(51) Int. Cl.
*C23C 14/08* (2006.01)
*B23B 27/14* (2006.01)

(52) U.S. Cl.
USPC .......... 428/336; 51/307; 51/309; 204/192.1; 204/192.15; 204/192.16; 428/698; 428/701; 428/702

(58) Field of Classification Search
USPC ................ 51/307, 309; 428/336, 697, 698, 428/699, 701, 702; 204/192.1, 192.15, 192.16
See application file for complete search history.

(56) References Cited

U.S. PATENT DOCUMENTS

| | | | |
|---|---|---|---|
| 3,498,837 A | | 3/1970 | Alstad et al. |
| 3,990,860 A | * | 11/1976 | Fletcher et al. ............. 428/472 |
| 5,447,804 A | | 9/1995 | Schulz et al. |
| 5,879,823 A | | 3/1999 | Prizzi et al. |
| 6,224,968 B1 | * | 5/2001 | Van Den Berg et al. ...... 428/697 |
| 6,235,416 B1 | * | 5/2001 | Konig et al. .................. 428/701 |
| 6,333,099 B1 | * | 12/2001 | Strondl et al. ................ 428/699 |
| 6,660,371 B1 | | 12/2003 | Westphal et al. |
| 6,726,987 B2 | * | 4/2004 | Kathrein et al. ............. 428/702 |
| 6,767,627 B2 | * | 7/2004 | Morikawa et al. ........... 428/336 |
| 7,914,913 B2 | * | 3/2011 | Fang et al. .................... 428/697 |
| 7,939,181 B2 | * | 5/2011 | Ramm et al. ................. 428/701 |
| 8,025,991 B2 | * | 9/2011 | Schier .......................... 428/698 |

FOREIGN PATENT DOCUMENTS

| | | |
|---|---|---|
| DE | 196 51 592 | 6/1997 |
| DE | 197 41 800 | 3/1998 |
| DE | 196 41 468 | 4/1998 |
| DE | 197 37 470 | 7/1998 |
| DE | 199 42 303 | 3/2000 |
| DE | 199 37 284 | 2/2001 |
| DE | 10 2004 044 240 | 3/2006 |
| JP | 06-322517 | * 11/1994 |
| JP | 2002-053946 | * 2/2002 |

* cited by examiner

*Primary Examiner* — Archene Turner
(74) *Attorney, Agent, or Firm* — Morgan, Lewis & Bockius LLP

(57) ABSTRACT

The invention concerns a cutting tool having a base body and a single-layer or multi-layer coating applied thereto. To provide cutting tools which are improved over the state of the art it is proposed according to the invention that the coating includes at least one two-phase or multi-phase layer which contains at least two different phases of metal oxide, wherein the at least one two-phase or multi-phase layer is electrically conductive.

23 Claims, 1 Drawing Sheet

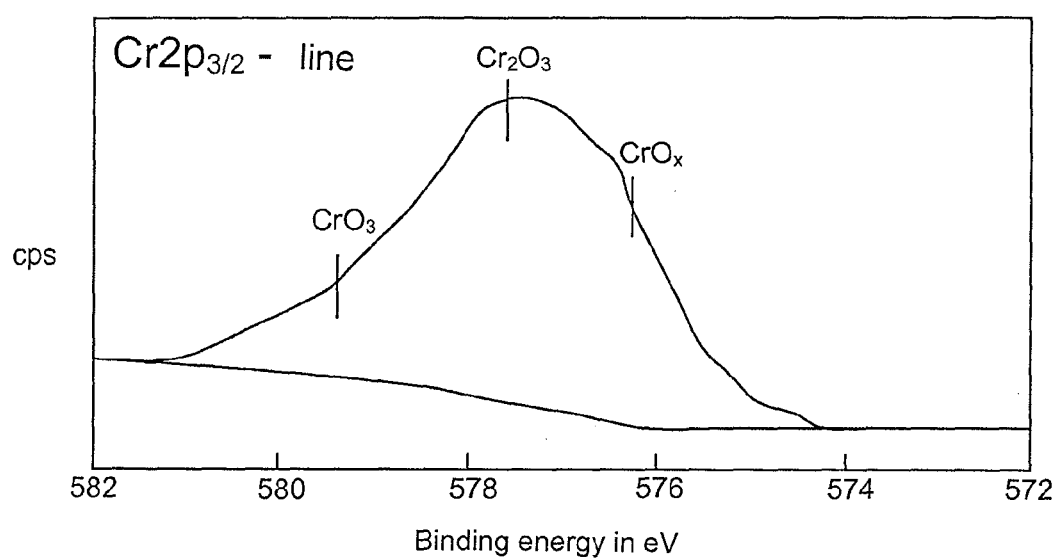

COATED TOOL

RELATED APPLICATION DATA

This application is a §371 National Stage Application of PCT International Application No. PCT/EP2008/056038 filed May 16, 2008, and also claims priority under 35 U.S.C. §119 and/or §365 to German Application No. 10 2007 030 734.0, filed Jul. 2, 2007.

The invention concerns a cutting tool having a base body and a single-layer or multi-layer coating applied thereto.

STATE OF THE ART

Cutting tools comprise a base body which is made for example from hard metal or carbide metal, cermet, steel or high-speed steel. Frequently a single-layer or multi-layer coating is applied to the base body to increase the service lives or also to improve the cutting properties. That single-layer or multi-layer coating includes for example metallic hard material layers, oxide layers and the like. CVD processes (chemical vapour deposition) and/or PVD processes (physical vapour deposition) are used for applying the layer. A plurality of layers within a coating can be applied exclusively by means of CVD processes, exclusively by means of PVD processes or by a combination of those processes. CVD processes provide substantially stable phases of the desired compounds whereas PVD processes also make it possible to apply metastable phases of compounds.

In regard to the PVD processes, a distinction is made between various variants such as for example magnetron sputtering, arc vapour deposition (arc PVD), ion plating, electron beam evaporation and laser ablation. Magnetron sputtering and arc vapour deposition are among the PVD processes which are most frequently used for coating tools. There are in turn different modifications or variations of those PVD process variants such as for example pulsed or unpulsed magnetron sputtering or pulsed or unpulsed arc vapour deposition and so forth.

DE 10 2004 044 240 A1 discloses a cutting tool with a layer structure having at least one single-phase, metastable, at least ternary oxide layer, wherein the oxide layer, besides oxygen, includes at least two further chemical elements selected from the elements in subgroups IV, V or VI of the period system, aluminium and silicon, of which one of the elements forms a primary component and at least a further one of the elements forms at least one secondary component.

DE 199 37 284 A1 describes an electrically conducting multi-layer structure on a metallic substrate with a first layer comprising a metal material, in particular chromium, which is surface-passivating by naturally formed oxide, and a further layer applied by means of a PVD process comprising a gold or gold alloy material. That second layer is capable of at least partially neutralising the electrically insulating action of the naturally formed oxide film of the first layer. Arrangements which are coated in that way are used for example as carrier parts for screened mounting of electronic components.

DE 196 51 592 A1 describes a coated cutting tool having a multi-layer coating which includes at least an aluminium oxide layer and metallic hard material layers. The metallic hard material layers are for example TiAlN layers applied by means of PVD processes. The aluminium oxide layer applied directly thereto is also deposited using a PVD process.

DE 199 42 303 A1 describes a cutting insert bit having a multi-phase aluminium oxide layer produced by a CVD process. The layer produced by the CVD process contains aluminium oxide, zirconium oxide and a third finely dispersed phase comprising an oxide, oxycarbide, oxynitride or oxycarbonitride of titanium.

DE 197 37 470 A1 describes a cutting body having a coating which has at least one multi-phase layer. The coating produced by a CVD process includes for example a zirconium carbonitride layer (cubic ZrCN) and $ZrO_2$ in monoclinic and/or tetragonal form. The crystalline ZrCN matrix acts as a hard coating whereas the $ZrO_2$ incorporated therein acts as a dry lubricant.

DE 196 41 468 A1 describes a composite body such as for example a cutting tool having a multi-layer coating with thin aluminium oxide layers and/or zirconium oxide layers.

In coating cutting tools, in particular using a PVD process, only relatively thin coatings can be applied because of the normally insulating properties of the deposited layers. With an increasing layer thickness the procedure for deposition of the ions out of the plasma becomes unstable, which manifests itself for example particularly severely at the corners and edges of the coated body and detrimentally influences the hardness of the layers. To produce a cutting tool having a hard coating which has good properties even when greater layer thicknesses are involved stabilisation of the deposition procedure would therefore be desirable over a prolonged period of time, that is to say even when greater layer thicknesses are involved.

OBJECT

The object of the present invention was that of providing cutting tools which are improved over the state of the art.

The object according to the invention is attained by a cutting tool having a base body and a single-layer or multi-layer coating applied thereto, which is characterised in that the coating includes at least one two-phase or multi-phase layer which contains at least two different phases of metal oxide, wherein the at least one two-phase or multi-phase layer is electrically conductive.

As already stated hereinbefore, the application of a single-layer or multi-layer coating to a cutting tool as a wear-resistant coating has long been known. What is novel in contrast is the production of such a coating with at least one two-phase or multi-phase layer which is electrically conductive and contains two different phases of metal oxide. That novel coating of the present invention opens up a wide range of possible options in terms of improving and/or adapting the resistance to wear, the service lives and/or the cutting properties of cutting tools.

The resistance to wear, service life and cutting properties of a coating on a cutting tool depend on various factors such as for example the material of the base body of the cutting tool, the sequence, nature and composition of further layers present in the coating, the thickness of the various layers and not last the nature of the cutting operation performed with the cutting tool. For one and the same cutting tool, different resistances to wear can occur in dependence on the nature of the workpiece to be machined, the respective machining process and the further conditions during machining such as for example the generation of high temperatures or the use of corrosive cooling fluids. In addition a distinction is drawn between various kinds of wear which depending on the respective machining operation can influence the useful life of a tool, that is to say its service life, to a greater or lesser degree. Therefore further development of and improvement in cutting tools is always to be considered having regard to which tool properties are to be improved and is to be assessed under comparable conditions in relation to the state of the art.

The at least one two-phase or multi-phase electrically conductive layer with at least two different phases of metal oxide, which is present in the coating according to the invention, can impart to the entire coating of the cutting tool properties which make the cutting tool superior to known cutting tools in comparable cutting operations and under comparable conditions. Those properties can involve resistance to wear, service lives, cutting properties or combinations thereof.

In a preferred embodiment of the invention in the coating the at least two different phases of metal oxide in the at least one two-phase or multi-phase electrically conductive layer are at least two different phases of chromium oxide. The at least one two-phase or multi-phase layer can substantially completely consist of chromium oxide. Preferably it includes chromium oxide at least as a main component, that is to say in an amount which is predominant in relation to possible further components, with a proportion of chromium in relation to other metallic elements of at least 80 atomic %, preferably at least 90 atomic %, particularly preferably at least 95 atomic %. As a secondary component the at least two-phase or multi-phase layer can contain carbides, nitrides, oxides, carbonitrides, oxynitrides, oxycarbides, oxycarbonitrides, borides, boronitrides and oxoboronitrides of the elements of groups IVa to VIIa of the periodic system and/or aluminium and/or silicon, hybrid metallic phases and phase mixtures of the aforementioned compounds, wherein chromium is excluded as an element of the secondary component.

Main component in accordance with the present invention signifies that the metallic element is present in relation to other metallic elements of the same layer in an amount of at least 80 atomic %, preferably at least 90 atomic %, particularly preferably at least 95 atomic %. The compounds of the other metals in the same layer are referred in accordance with the present invention as a secondary component.

In a further embodiment the at least one two-phase or multi-phase layer has at least three phases, wherein there is at least one phase of aluminium oxide. In this embodiment the other metal oxide which is not aluminium oxide and of which there are at least two different phases in the layer can be present as the main component and aluminium oxide as the secondary component. In a preferred variant of this embodiment the two-phase or multi-phase layer contains at least two phases of chromium oxide as the main component and a phase of aluminium oxide as the secondary component or hybrid phases of chromium oxide and aluminium oxide.

In a further embodiment of the invention one of the metal oxide phases in the two-phase or multi-phase layer is a stable phase of metal oxide. In the embodiment according to the invention in which the at least one two-phase or multi-phase layer contains chromium oxide as the main component, the stable phase of metal oxide is preferably a phase of $Cr_2O_3$.

In a further embodiment of the invention at least one of the metal oxide phases in the two-phase or multi-phase layer is a metastable phase. In the embodiment in which the at least one two-phase or multi-phase layer contains chromium oxide as the main component the metastable phase is preferably a metastable phase of chromium oxide of the stoichiometry $CrO_x$, with $0.7 \leq x \leq 1.3$.

The term "stable phase" in accordance with this invention signifies a phase which under the given conditions is in a thermodynamically stable equilibrium state and does not change.

The term "metastable phase" in accordance with this invention signifies a phase which is only apparently in a thermodynamic equilibrium state because under the given conditions such as for example pressure and/or temperature the equilibrium setting speed, that is to say the transition into the thermodynamically stable, lower-energy state, is too low. Metastable phases or states are such phases or states which only go into stable phases or states by elimination of an impediment. Elimination of the impediment can be effected by input of energy such as for example an increase in temperature or pressure.

In a preferred embodiment of the invention in which the at least two different phases of metal oxide in the two-phase or multi-phase layer are chromium oxide phases, the elements chromium and oxygen taken together in the stable and metastable phases involve a ratio of Cr to O of about 1 to 0.8-1.2. If the ratio of Cr to O is greater than 1 to 0.8 (that is to say 1 to <0.8), that has the disadvantage that the layer becomes too soft. If the ratio of Cr to O is less than 1 to 1.2 (that is to say 1 to >1.2) that has the disadvantage that the layer becomes too brittle.

In a further preferred embodiment of the invention among the at least two different phases of metal oxide in the at least one two-phase or multi-phase layer at least one metal oxide phase is electrically conductive. If the main component of the two-phase or multi-phase layer comprises chromium oxide, then no phase of $CrO_2$ which considered in itself would represent a conductive chromium oxide phase is included. The absence of a phase of $CrO_2$ in the electrically conductive layer can be detected by means of XPS measurement. In such a layer containing chromium oxide as the main component, phases of $Cr_2O_3$, $CrO_3$, $CrO_x$ with $0.7 \leq x \leq 1.3$ were detected by means of XPS measurement, but no phase of $CrO_2$ (see FIG. 1). The electrical conductivity of the two-phase or multi-phase layer is therefore not based on the presence of $CrO_2$ which is electrically conductive in itself.

The at least one two-phase or multi-phase layer of the coating is preferably of a layer thickness of 10 nm to 50 μm. If the layer thickness of the two-phase or multi-phase layer is less than 10 nm, its protective or wear resistance function is excessively low. If the layer thickness of the two-phase or multi-phase layer is greater than 50 μm excessively high stresses occur in the layer and the layer becomes too brittle, and that can lead to adhesion problems and spalling in operation of the tool. In a further embodiment the layer is of a layer thickness of 20 nm to 20 μm. In still a further embodiment the layer is of a layer thickness of 0.5 μm to 4 μm.

Usually the at least one two-phase or multi-phase layer is of a Vickers hardness (Hv) of 500 to 4000. In a preferred embodiment the layer is of a Vickers hardness (Hv) of 700 to 3000. In still a further preferred embodiment the layer is of a Vickers hardness (Hv) of 800 to 2000.

The electrical conductivity of the at least one two-phase or multi-phase layer in the coating of the present invention is markedly higher than that of non-conductors and semiconductors and is of the order of magnitude of metallic conductors. It is desirably more than 1 S/m. Preferably the electrical conductivity is more than 100 S/m. In a further embodiment the layer is of an electrical conductivity of more than $10^4$ S/m.

The electrical conductivity of the two-phase or multi-phase layer contained in the coating according to the invention is a surprising phenomenon as the layer as the main component contains metal oxides which are usually non-conducting. The conductivity of the layer is also not to be attributed to the presence of phases of pure metals as they are to be found in the layer not at all or only in negligibly small amounts which cannot explain electrical conductivity of the overall layer. The two-phase or multi-phase layer in the coating of the invention also does not contain any phases of metal oxides which considered in themselves are known to be electrically conductive such as for example $CrO_2$, in proportions which could explain electrical conductivity of the overall layer.

It is not possible at the present time to provide a definite explanation of the electrical conductivity of the two-phase or multi-phase layers according to the invention in the coating. It is assumed however that the two-phase or multi-phase layer according to the invention contains metastable, non-stoichiometric metal oxide phases which impart to the overall layer electrical conductivity of the order of magnitude of the conductivity of metals and which contribute to the excellent material properties of the coating according to the invention.

In a further embodiment of the invention the at least one two-phase or multi-phase layer further has at least one secondary component. As a secondary component or components the at least one two-phase or multi-phase layer can contain carbides, nitrides, oxides, carbonitrides, oxynitrides, oxycarbides, oxycarbonitrides, borides, boronitrides and oxoboronitrides of the elements of groups IVa to VIIa of the periodic system and/or aluminium and/or silicon, hybrid-metallic phases and phase mixtures of the aforementioned compounds. Examples of such secondary compounds are (Al, Cr)$_2$O$_3$ with a ratio by weight of Al:Cr=9:1, (Cr, Al, Si)$_2$O$_3$ with a ratio by weight of Al:Si=9:1 and Cr:(Al, Si)=1:2.

If the coating of the cutting tool according to the invention is of a multi-layer structure it can include further hard material layers of the compositions specified hereinbefore for the secondary components. Examples of such hard material layers are layers comprising Al$_2$O$_3$, TiN, TiB$_2$, cBN, hBN, TiBN, TiC, TiCN, TiN, TiAlN, CrAlN, TiAlCN, TiAlYN, TiAlCrN and CrN. Instead of or in addition to one or more hard material layers the coating can have one or more further two-phase or multi-phase layers which contain at least two different phases of metal oxide and are electrically conductive. The present invention thus includes coatings which only comprise one or more of the two-phase or multi-phase layers with at least two different phases of metal oxide of electrical conductivity, and also coatings which include any combination of such layers with further hard material layers in any number and sequence.

Preferred coatings of the cutting tool according to the invention involve the following layers:

(Al, Cr)$_2$O$_3$—AlCrN—(Al, Cr)O,
TiAlN—(Al, Cr)O,
AlCrN—(Al, Cr)O,
TiAlN—Al$_2$O$_3$—(Al, Cr)O,
CrAlN—[(Al, Cr)O—Al$_2$O$_3$]$_x$—ZrN

The two-phase or multi-phase layer contained in the coating of the cutting tool according to the invention, having at least two different phases of metal oxide and of electrical conductivity, is preferably produced by a PVD process, particularly preferably by magnetron sputtering, arc vapour deposition (arc PVD) or modifications of those processes. In the PVD coating installation a plasma atmosphere is produced at low pressure, which substantially comprises argon and oxygen. In the PVD magnetron process an argon plasma is fired in front of the target. High-power cathode sputtering occurs (magnetron sputtering). The metal vapour produced from the target in that way is deposited on the substrate with a reaction with the oxygen as a metal oxide layer.

Further advantages, features and embodiments of the present invention are described by reference to the following examples and the FIGURE.

EXAMPLE 1

In a PVD coating installation (Flexicoat; Hauzer Techno Coating) hard metal substrates were provided with a two-layer PVD coating. Prior to deposition of the layers the installation was evacuated to $1\times10^{-5}$ mbars and the hard metal surface was cleaned by ion etching at 170 V bias voltage.

Substrate Compositions:
1) HM-fine grain+10.5% by weight Co
2) HM-coarse grain+10.5% by weight Co+1% by weight MC
3) HM-coarse grain+11.0% by weight Co+1% by weight MC (Explanation:
HM-fine grain=WC hard metal of mean grain size of ~1 μm
HM-coarse grain=WC hard metal of mean grain size of 3-5 μm)
MC=mixed carbides (TiC, TaC . . . ).

Substrate Geometry:
SEHW120408 (in accordance with DIN-ISO 1832)

Deposition of the Layers:
1st Layer: TiAlN
  arc deposition
  target: Ti/Al (33/67 atomic %), round source (63 mm diameter),
  80 amperes, 495° C., 3 Pa N$_2$ pressure, 40 volts substrate bias voltage,
  3 μm layer thickness;
2nd Layer: (Al, Cr)$_2$O$_3$
  reactive magnetron sputtering,
  target: Al/Cr (90/10 atomic %), round source (63 mm diameter),
  10 kW sputter power, 495° C., 0.5 Pa Ar pressure, about 100 sccm O$_2$, 150 volts substrate bias voltage (unipolarly pulsed),
  1 μm layer thickness.

The TiAlN layer serves for bonding between the substrate and the oxidic layer. XRD measurements, XPS measurements, microprobe measurements and resistance measurements were performed on the coating. The microprobe measurements for determining the overall composition were performed on a single (Al, Cr)$_2$O$_3$ layer as measurements on the layer composite TiAlN—(Al, Cr)$_2$O$_3$ with the microprobe leads to measurement errors. Resistance and conductivity measurements showed that the (Al, Cr)$_2$O$_3$ layer in the case of all substrates was overall electrically conductive, with conductivity levels of about 10 S/m.

It was established by XRD and XPS measurement that the (Al, Cr)$_2$O$_3$ layer in the case of all substrates contained a stable γ-Al$_2$O$_3$ phase, two stable Cr-oxide phases (CrO$_3$, Cr$_2$O$_3$) and a metastable Cr-oxide phase (CrO$_x$). FIG. 1 shows the XPS spectrum of Cr (Mg Kα radiation). XPS measurement confirmed that the layer contained a total of 3 chromium oxide phases. The phase proportions estimated from XPS measurement were approximately as follows:
  Cr$_2$O$_3$ 65% by weight
  CrO$_x$ 20% by weight
  CrO$_3$ 15% by weight,
wherein x was 0.9. In addition the results of the measurement operations showed that, within the (Al, Cr)$_2$O$_3$ layer, the metastable Cr-oxide phase was the only one of the metal oxide phases which was electrically conductive and imparted conductivity to the overall layer. A phase of conductive CrO$_2$ could be excluded by virtue of the ascertained phase proportions and the proportion of oxygen determined by microprobe measurement.

COMPARATIVE EXAMPLE

For comparison purposes the same substrates as in Example 1 were provided in the same coating installation with a two-layer coating of the layer sequence 3 μm TiAlN-1 μm Al$_2$O$_3$. The deposition conditions were the same as in Example 1 with the exception that a pure Al target was used in the step for the deposition of the $Al_2O_3$ layer.

In a milling trial on a workpiece comprising 42CrMoV4 steel (strength: 850 MPa) the tools of Example 1 and the comparative example were compared. Milling was effected in the downcut mode without cooling lubricant at a cutting speed $V_c$=236 m/min and a tooth feed $f_z$=0.2 mm.

The amount of wear was measured on the tool flank surface in the form of the average wear mark width VB in mm (at the main cutting edge) after a milling travel of 4800 mm. The following wear mark widths VB were found:

|  | Wear mark width VB |
| --- | --- |
| Example 1: | 0.09 mm |
| Comparative example: | 0.12 mm |

The invention claimed is:

1. A cutting tool having a base body and a single-layer or multi-layer coating applied thereto, wherein the coating includes at least one two-phase or multi-phase layer which contains at least two different phases of metal oxide, wherein the at least one two-phase or multi-phase layer is electrically conductive,
    wherein the at least two different phases of metal oxide in the at least one two-phase or multi-phase electrically conductive layer are at least two different phases of chromium oxide, and
    wherein at least one of the metal oxide phases in the two-phase or multi-phase electrically conductive layer is a metastable phase of chromium oxide of the stoichiometry $CrO_x$, with $0.7 \leq x \leq 1.3$.

2. A cutting tool according to claim 1 wherein the at least one two-phase or multi-phase layer contains chromium oxide as the main component.

3. A cutting tool according to claim 1, wherein the at least one two-phase or multi-phase layer has at least three phases, wherein there is at least one phase of aluminium oxide.

4. A cutting tool according to claim 1, wherein one of the metal oxide phases in the two-phase or multi-phase layer is a stable of $Cr_2O_3$.

5. A cutting tool according to claim 1, wherein the at least two different phases of metal oxide in the two-phase or multi-phase layer are chromium oxide phases which taken together have a ratio of the elements Cr to O of about 1 to 0.8-1.2.

6. A cutting tool according to claim 1, wherein among the at least two different phases of metal oxide in the at least one two-phase or multi-phase layer at least one metal oxide phase is electrically conductive.

7. A cutting tool according to claim 1, wherein the metal oxide phases in the two-phase or multiphase layer do not include a phase of $CrO_2$.

8. A cutting tool according to claim 1, wherein the at least one two-phase or multi-phase layer is of a layer thickness of 10 nm to 50 μm.

9. A cutting tool according to claim 8, wherein the layer thickness is 20 nm to 20 μm.

10. A cutting tool according to claim 9, wherein the layer thickness is 0.5 μm to 4 μm.

11. A cutting tool according to claim 1, wherein the at least one two-phase or multi-phase layer is of a Vickers hardness (Hv) of 500 to 4000.

12. A cutting tool according to claim 11, wherein the Vickers hardness (Hv) is 700 to 3000.

13. A cutting tool according to claim 12, wherein the Vickers hardness (Hv) is 800 to 2000.

14. A cutting tool according to claim 1, wherein the at least one two-phase or multi-phase layer is of an electrical conductivity of more than 1 S/m.

15. A cutting tool according to claim 14, wherein the electrical conductivity is more than 100 S/m.

16. A cutting tool according to claim 15, wherein the electrical conductivity is more than $10^4$ S/m.

17. A cutting tool according to claim 1, wherein the at least one two-phase or multi-phase layer further has at least one secondary component formed by elements of subgroups IV, V or VI of the periodic system of the elements, aluminium and/or silicon and O, N, C and/or B.

18. A cutting tool according to claim 1, wherein the coating includes further hard material layers formed by elements of subgroups IV, V or VI of the periodic system of the elements, aluminium and/or silicon and O, N, C and/or B.

19. A cutting tool according to claim 1, wherein the at least one two-phase or multi-phase layer is produced by a PVD process or modifications of said process.

20. A cutting tool according to claim 19, wherein the PVD process is magnetron sputtering, arc vapour deposition (arc PVD) or modifications of said processes.

21. A cutting tool according to claim 1, wherein the base body is made from hard metal or carbide metal, cermet, steel or high-speed steel (HSS).

22. A cutting tool according to claim 1, wherein the coating includes at least two of the two-phase or multi-phase layers, and wherein the at least two of the two-phase or multi-phase layers are arranged in directly superposed relationship or are separated from each other by one or more further hard material layers.

23. A cutting tool according to claim 22 wherein the at least two of the two-phase or multi-phase layers are of different compositions, different Vickers hardnesses (Hv) and/or different conductivities.

* * * * *